United States Patent
Ishihara et al.

(10) Patent No.: US 6,491,760 B2
(45) Date of Patent: Dec. 10, 2002

(54) SCRUB WASHING METHOD

(75) Inventors: Akira Ishihara, Tosu (JP); Akira Yonemizu, Kumamoto (JP); Takanori Miyazaki, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/892,090

(22) Filed: Jun. 26, 2001

(65) Prior Publication Data

US 2001/0035200 A1 Nov. 1, 2001

Related U.S. Application Data

(62) Division of application No. 09/281,531, filed on Mar. 30, 1999, now Pat. No. 6,292,972.

(30) Foreign Application Priority Data

Mar. 30, 1998 (JP) .............................. 10-102165

(51) Int. Cl.⁷ .............................. B08B 1/02; B08B 3/04; A46B 13/04
(52) U.S. Cl. .................. 134/6; 134/7; 134/32; 134/33; 134/25.4; 134/902; 15/21.1; 15/77; 15/88.2; 15/102
(58) Field of Search ............................ 134/6, 7, 32, 33, 134/25.4, 902; 15/21.1, 77, 102, 88.2

(56) References Cited

U.S. PATENT DOCUMENTS 5,475,889 A * 12/1995 Thrasher et al. ............ 15/77
5,518,542 A * 5/1996 Matsukawa et al. ........ 15/77
5,636,401 A * 6/1997 Yonemizu et al. .......... 15/77
5,651,160 A * 7/1997 Yonemizu et al. .......... 15/77
5,685,039 A * 11/1997 Hamada et al. ............. 15/77
5,829,087 A * 11/1998 Nishimura et al. ......... 15/77
5,858,112 A * 1/1999 Yonemizu et al. .......... 15/77
5,964,954 A * 10/1999 Matsukawa et al. ........ 15/77
5,966,765 A * 10/1999 Hamada et al. ............. 15/77

FOREIGN PATENT DOCUMENTS

JP  8-141518  * 6/1996
JP  8-141519  * 6/1996

* cited by examiner

*Primary Examiner*—Zeinab El-Arini
(74) *Attorney, Agent, or Firm*—Morrison & Foerster LLP

(57) ABSTRACT

A scrub washing apparatus comprises a spin chuck for holding a substrate to be processed substantially horizontally, a nozzle for supplying a washing liquid to the substrate mounted on the spin chuck, an arm vertically and horizontally movably supported, an output shaft provided at the arm, a sponge brush connected directly or indirectly to the output shaft, for scrubbing the substrate on the spin chuck in contact therewith, a press mechanism moving the sponge brush downward together with the output shaft, for pressing the sponge brush against the substrate on the spin chuck, and a rotation drive mechanism provided above the press mechanism at a position where the rotation drive mechanism is capable of being engaged with the output shaft, for directly rotating the sponge brush by engaging with the output shaft.

5 Claims, 7 Drawing Sheets

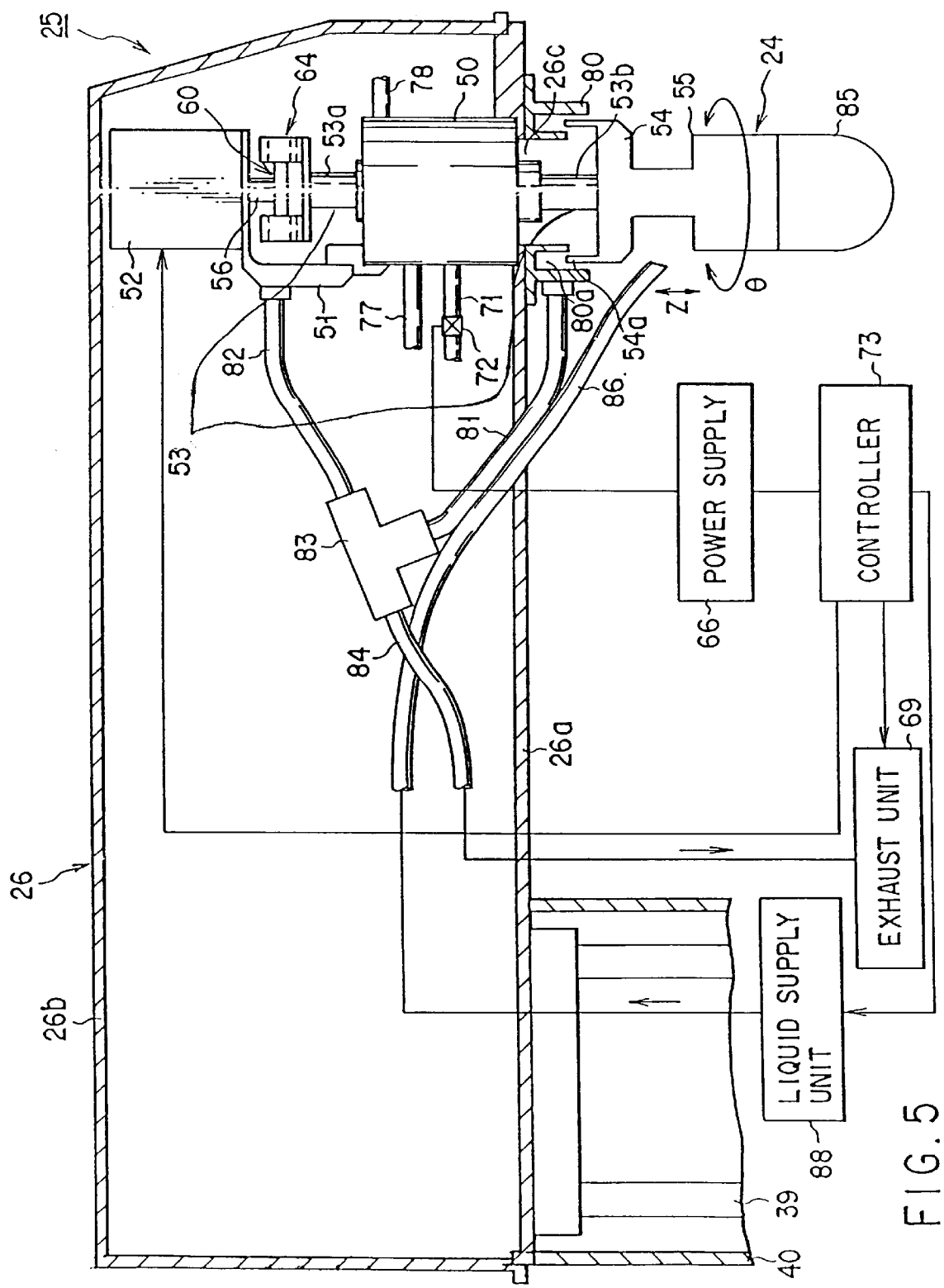
F I G. 5

SCRUB WASHING METHOD

This is a division of U.S. patent application Ser. No. 09/281,531 filed Mar. 30, 1999, now U.S. Pat. No. 6,292, 972.

BACKGROUND OF THE INVENTION

The present invention relates to a scrub washing apparatus and scrub washing method for washing a substrate such as a semiconductor wafer and an LCD glass substrate.

In manufacturing steps of semiconductor devises, a single-processing substrate washing system is used for removing contaminants, such as particles, organic compounds, and metal ions, attached to a surface of a semiconductor wafer. The single-processing substrate washing system has a scrub washing apparatus for scrubbing away attached materials (contaminants) from the surface of the wafer by brining a brush or a sponge (hereinafter referred to as "scrub member") into contact with the wafer in rotation.

The scrub washing apparatus has a swingable horizontal arm, a vertical output shaft arranged at a tip portion of the horizontal arm, a scrub member directly or indirectly supported by the vertical output shaft, a rotation drive means for driving the rotation of the scrub member together with the vertical output shaft, and a press means for pressing the scrub member downward together with the vertical output shaft. A contact pressure of the scrub member to the substrate (hereinafter referred to as "scrub contact pressure") corresponds to a total force of a press force given to the scrub member by the press means and a weight of the scrub member itself. The surface of the substrate is desirably washed by properly controlling conditions including the scrub contact pressure, a rotation speed of the scrub member, a moving speed of the scrub member, and a rotation speed of the substrate, in accordance with the surface state of the substrate.

Such a scrub apparatus is disclosed in Japanese Patent Application KOKAI publication Nos. 8-141518, 8-141519. In these conventional apparatuses, an expandable bellows mechanism and an air cylinder mechanism are employed as the press means. For example, in the bellows mechanism described in Japanese Patent Application KOKAI 8-141518, the press force is applied to the vertical output shaft by expanding and contracting of the bellows fitted at an upper end of the vertical output shaft. In the air cylinder mechanism, the press force is applied from the cylinder to the vertical output shaft by protruding or retracting a piston rod attached to an upper end of the vertical output shaft. However, in the conventional apparatuses, if a rub resistance between the vertical output shaft and a bearing is changed, the press force may not be desirably transmitted to the scrub member. Since a belt mechanism is used as a rotation drive mean in the conventional apparatus, the rotation force may not be desirably transmitted to the scrub member because the tension of the belt varies. Furthermore, a driving force transmission mechanism of the conventional apparatus is complicated in structure since numerous mechanical elements such as a belt, a pulley, a bellows, an air cylinder, and a bearing, are assembled, resulting in generation of particles in a non-negligible amount. The generated particles are attached to the substrate, degrading the cleanliness of the substrate surface.

BRIEF SUMMARY OF THE INVENTION

An object of the present invention is to provide a scrub washing apparatus and method capable of transmitting a desired press force and a rotation driving force to a scrub member without fail and generating few amount of particles.

According to the present invention, there is provided a scrub washing apparatus comprising:

a mounting table for holding a substrate to be processed substantially horizontally;

a washing liquid supply mechanism for supplying a washing liquid to the substrate mounted on the mounting table;

an arm vertically and horizontally movably supported;

an output shaft provided at the arm;

a scrub member connected directly or indirectly to the output shaft, for scrubbing the substrate on the mounting table in contact therewith;

a press mechanism moving the scrub member together with the output shaft, for pressing the scrub member against the substrate on the mounting table; and a rotation drive me chanism provided above the press mechanism at a position where the rotation drive mechanism is capable of being engaged with a the output shaft, for directly rotating the scrub member by engaging with the output shaft.

In this case, the o utpu t shaft has an upper portion extending upward from the press mechanism, a driven engage member attached to the upper portion, and a lower portion extending downward from the press mechanism and connected to the scrub member; and the rotation drive mechanism has a rotation drive shaft extending downward and a drive engage member attached to a lower end of the rotation drive shaft.

The apparatus further comprises a liftable moving mechanism for moving the output shaft up and down to the press mechanism. The liftable moving mechanism moves up the output shaft to engage the driven engage member with the drive engage member, thereby transmitting the rotation drive force from the rotation driving mechanism to the output shaft.

The drive engage member preferably has a first connection board connected to the rotation drive shaft;

a horizontal support shaft attached to the first connection board; and a pair of rollers supported by the horizontal support shaft.

The driven engage member preferably has a second connection board connected to the output shaft;

a plurality of vertical projections respectively standing at corners of the second connection board; and depressed portions formed between two adjacent projections.

The output shaft is moved up by the liftable moving mechanism to engage the depressed portions with the pair of rollers, thereby transmitting rotation driving force from the rotation drive mechanism to the output shaft.

The driven engage member has a plurality of projections extending in direction of the rotation drive shaft. Depressed portions are formed between two adjacent projections. The drive engage member is engaged with the depressed portions.

According to the present invention, there is provided a scrub washing method of scrubbing a substrate with a scrub member while a washing liquid is supplied to the substrate by transmitting a press force and a rotation driving force to the scrub member by means of an output shaft and a rotation drive shaft, which comprises the steps of:

(a) setting a scrub contact pressure when the substrate is scrubbed with the scrub member, the output shaft being engaged with the rotation drive shaft and arranged on an extension line of the rotation drive shaft;

(b) mounting the substrate on a mounting table;

(c) moving the scrub member above the substrate mounted on the mounting table;

(d) moving down the scrub member together with the output shaft;

(e) transmitting a rotation drive force to the output shaft from the rotation drive shaft to rotate the scrub member; and (f) adjusting the pressing force of the scrub member to the substrate at the scrub contact pressure set at the step (a).

In the conventional apparatus, since the rotation drive shaft is located at a distance from the output shaft, a rotation driving force is transmitted to the output shaft from the rotation drive shaft by way of a belt and a pulley. Since the rotation driving force is transmitted indirectly, the output shaft is likely to be affected by various external disturbances (change in tension of a belt), with the result that up-and-down movement and rotation movement of the output shaft become unstable.

In contrast, in the apparatus of the present invention, since the rotation drive shaft is located immediately above the output shaft, the rotation driving force is transmitted directly from the rotation drive shaft to the output shaft. Since the rotation driving force is directly transmitted as described, the output shaft is not affected by the external disturbances, with the result that the up-and-down movement and the rotation movement of the output shaft become stable.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is an inner perspective view of a support arm and a scrub member;

DETAILED DESCRIPTION OF THE INVENTION

Now, various preferred embodiments of the present invention will be explained with reference to the accompanying drawings.

Figure 1:
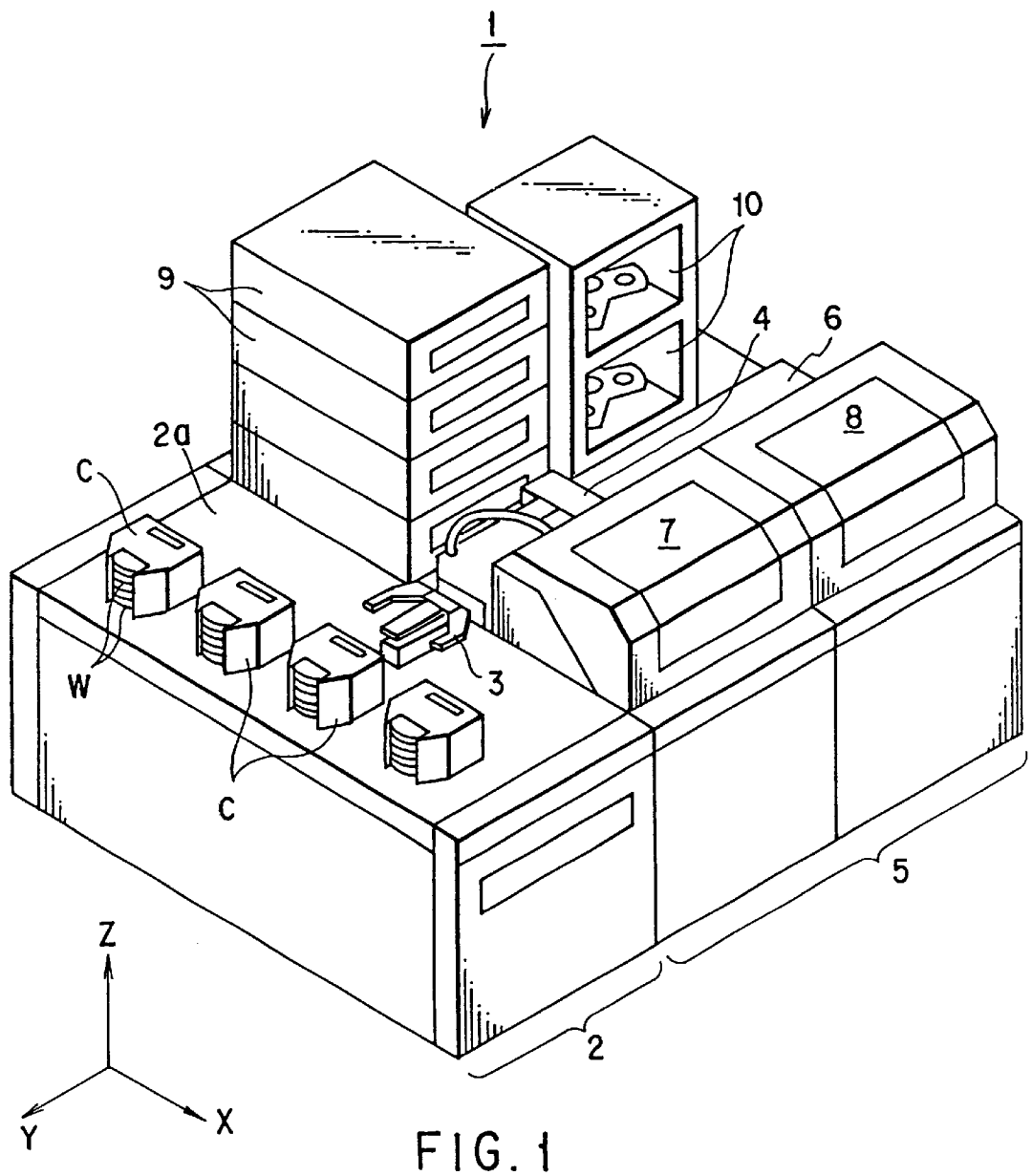
FIG. 1 is a schematic perspective view of a substrate washing system, shown partly cutaway.

As shown in FIG. 1, a substrate washing system 1 has a loader/unloader section 2, a process section 5, and transport arm mechanisms 3, 4. The loader/unloader section 2 has a mounting table 2a extending in an X-axis direction. In front of the mounting table 2a, a cassette transporting passage (not shown) is provided. A cassette C is transported by a transport robot (not shown) along the cassette transporting passage and mounted on the mounting table 2a. For example, four cassettes C are mounted on the mounting table 2a. Each cassette C stores 25 semiconductor wafers W which constitute one lot.

The sub transport arm mechanism 3 is arranged at a back surface side of the cassette mounting table 2a. A wafer W is taken out of the cassette C by the sub transport arm mechanism 3 and transferred to the main transport arm mechanism 4 of the process section 5.

The process section 5 has the main transport arm mechanism 4 and two washing units 7, 8, a dry unit 9, and a reverse unit 10. The main transport arm mechanism 4 is movably arranged along a transport passage 6 extending in the Y-axis direction. The washing units 7, 8 having a single-processing scrub washing apparatus are arranged along one of sides of the transport passage 6. The dry unit 9 and the reverse unit 10 are arranged on the other side of the transport passage 6. The dry unit 9 has a hot plate for heating the wafer W to dry. The reverse unit 10 has a mechanism for turning over the wafer W so as to change an upper surface to a lower surface of the wafer W. At the back surface side of the process section 5, a washing liquid supply apparatus (not shown) and a waste water collect apparatus (not shown) are arranged.

Each of the transport arm mechanisms 3, 4 has an arm portion, an X-axis drive mechanism (not shown), a Z-axis drive mechanism (not shown), a θ-rotation mechanism (not shown), and an arm back-and-forth driving mechanism (not shown). The arm portion is moved by the Z-axis drive mechanism (not shown) in the Z-axis direction, rotated around the Z-axis by the θ-rotation mechanism, and moved back and forth by the arm back-and-forth moving mechanism. The X-axis drive mechanism, Z-axis drive mechanism, θ-rotation mechanism, arm back-and-forth moving mechanism is controlled by a controller 73 shown in FIG. 5 on the basis of initially input data.

Figure 2:
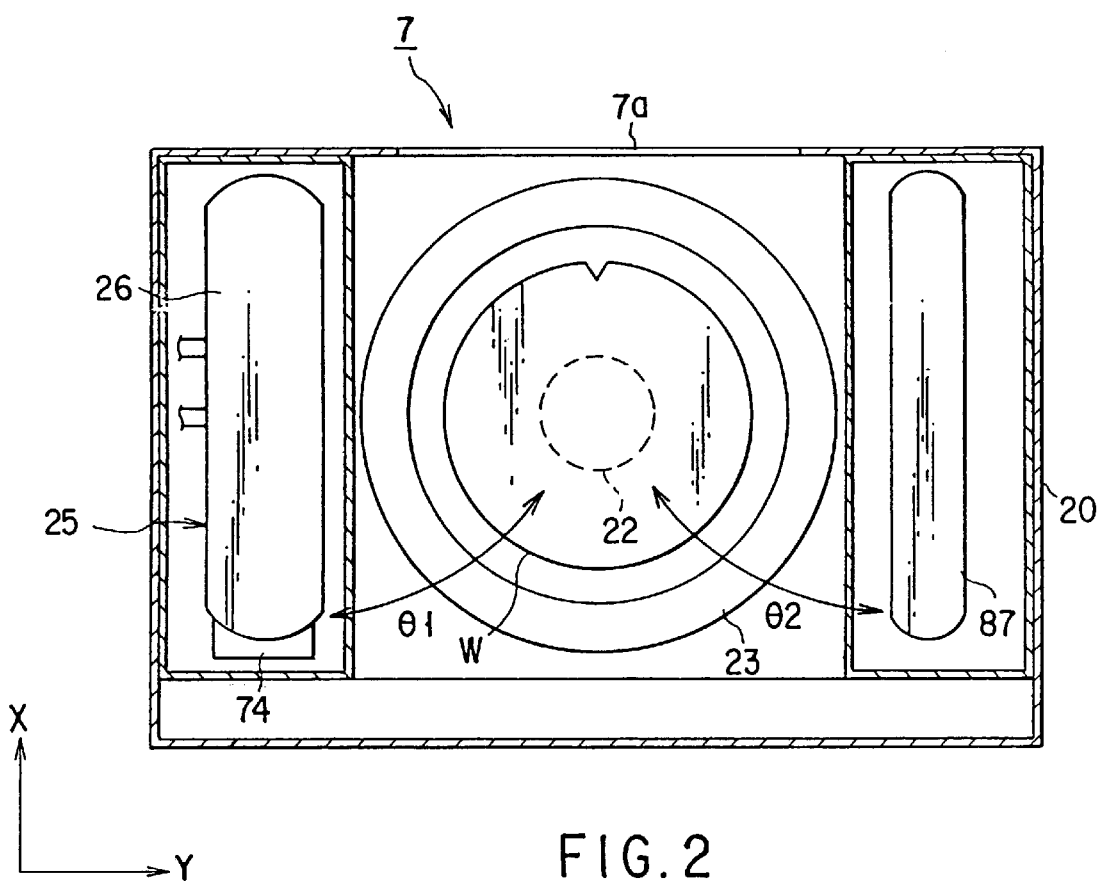
FIG. 2 is a schematical plan view of the scrub washing apparatus.
Figure 3:
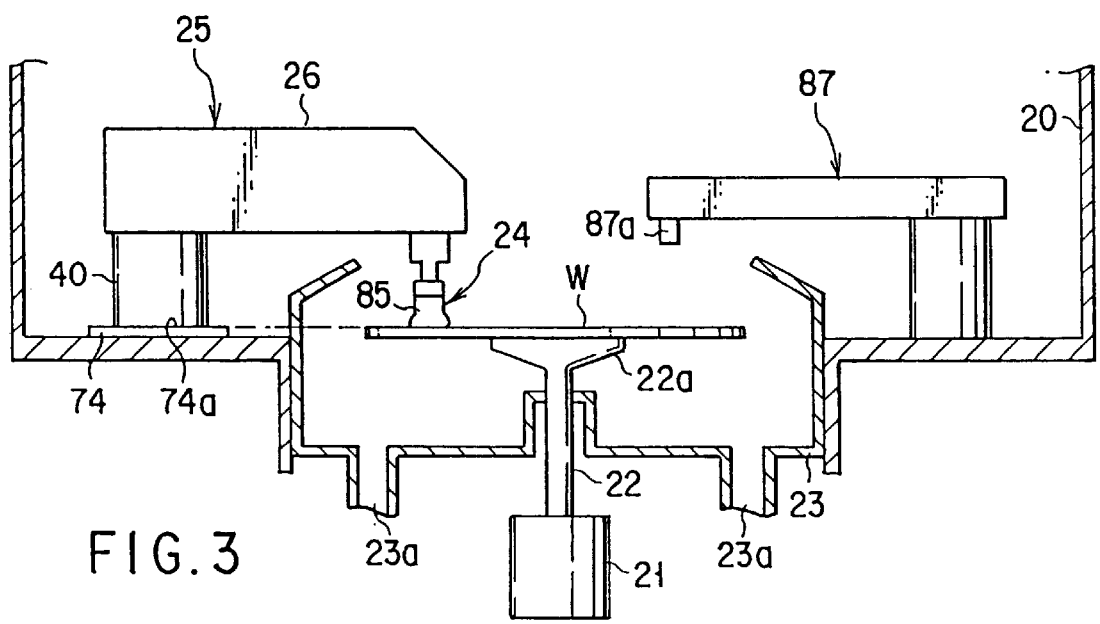
FIG. 3 is a longitudinal sectional view of the scrub washing apparatus.

Now, referring to FIGS. 2–5, the first process unit 7 will be explained. As shown in FIGS. 2 and 3, the process unit 7 is surrounded by a case 20 and having a loading/unloading port 7a in the front surface side of the case 20. The wafer W is loaded into and unloaded from the process unit 7 through the loading/unloading port 7a by the main transport arm mechanism 4. A spin chuck 22 is provided at near a center of the case 20. The spin chuck 22 has a mounting table 22a, a plurality of mechanical chucks (not shown) for holding the wafer W, and a motor 21 for rotating the mounting table 22a. The motor 21 is controlled by the controller 73. Incidentally, a vacuum adsorption mechanism may be used in place of the mechanical chuck serving as the holding means for the wafer W.

A cup 23 is provided so as to surround the wafer W on the spin chuck 22. The cup 23 is used for receiving liquid scattered from the wafer W. A drain 23a is formed at the bottom of the cup 23. The waste water is discharged from the cup 23 through the drain 23a.

A scrub washing mechanism 25 and a washing liquid supply mechanism 87 are arranged respectively at both sides of the cup 23. The scrub washing mechanism 25 has a scrub portion 24 having a sponge (scrub member) 85. The scrub portion 24 is provided at one end of the arm member 26. The arm member 26 is supported substantially horizontally by a support rod 39 covered with a cover 40 shown in FIG. 4.

As shown in FIG. 2, the washing liquid supply mechanism 87 is located so as to face the scrub washing mechanism with the spin shuck 22 interposed there-between. A nozzle 87a is attached to an arm tip portion of the washing liquid supply mechanism 87. Pure water is supplied to the nozzle 87a from a liquid supply unit 88 (shown in FIG. 5). Note that an arm swinging angle θ2 of the washing liquid supply mechanism is equal to a swinging angle θ1 of the arm member 26 of the scrub washing mechanism 25.

As shown in FIGS. 2 and 3, a sensor 74 is provided at a home position in which the scrub portion 24 is stand-by when it is not used. The sensor 74 measures a scrub contact pressure of the scrub portion 24. The sensor 74 is formed of, for example, load cells which detect distortion by weight loading, in terms of a change in electrical resistance value. The sensor 74 is brought into contact with the scrub portion 24 when the scrub portion is not in use, thereby determining the contact pressure. Data of the electric signal is obtained when the scrub contact pressure is equal to a desired pressure value on the basis of the determination results, and then stored in the control section 73. The "desired pressure value" corresponds to the scrub contact pressure previously obtained by a trial washing test in which a dummy wafer DW is scrub-washed by the scrub portion 24 used in practice.

When the wafer is washed in practice, the controller 73 outputs the desired pressure data from the memory and sends it to an electrical air supply regulator 72 (shown in FIGS. 5 and 9) to control a supply pressure of air to be supplied to the air cylinder 50. In this way, the scrub contact pressure of the scrub portion 24 to the wafer W, can be properly controlled. In this case, it is desirable that the height of a measurement surface 74a of the sensor 74 be equal to the height of the upper surface of the wafer W held by the spin chuck 22, as shown in FIG. 3.

Figure 4:
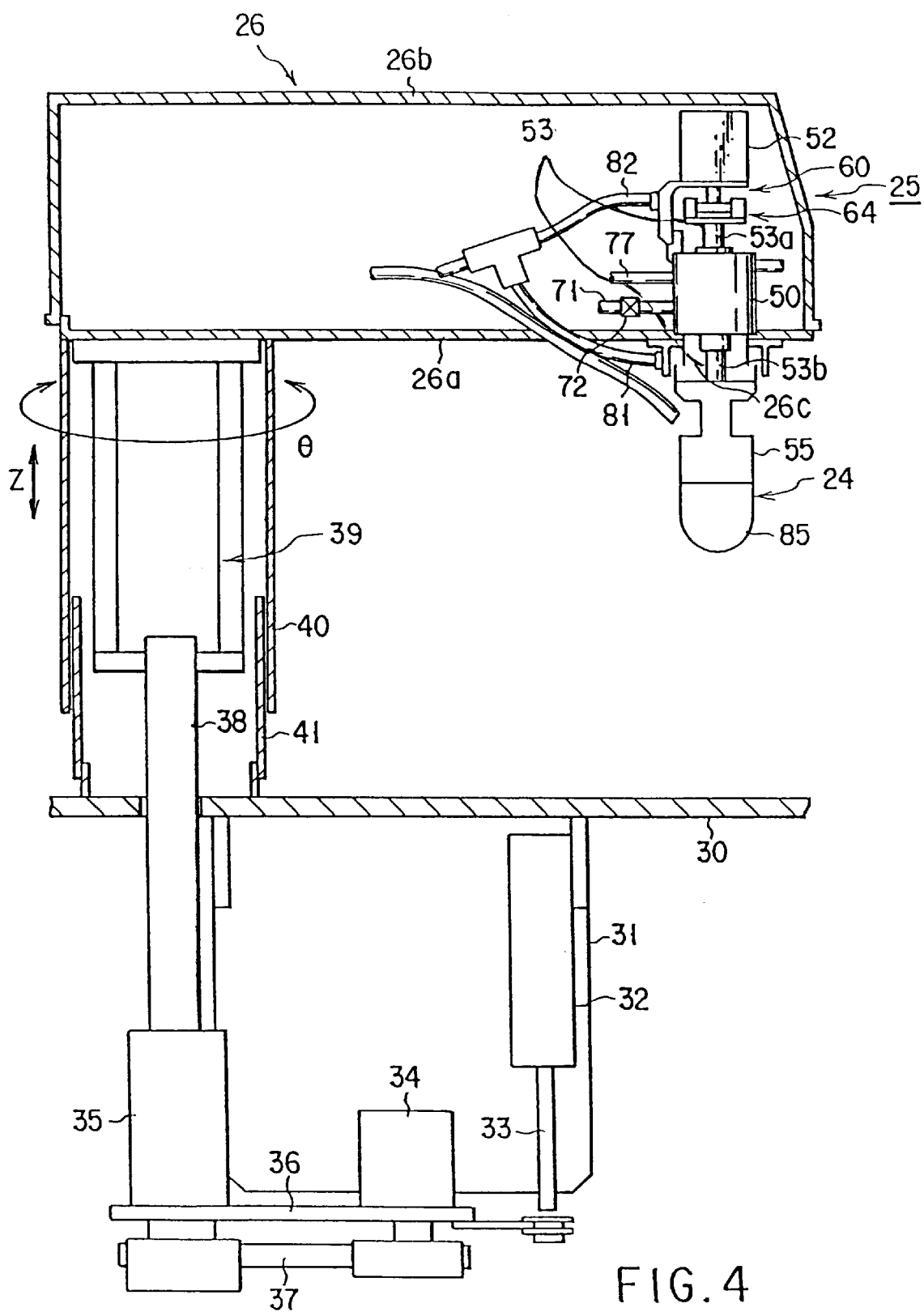
FIG. 4 is an inner perspective view of a driving section of the scrub washing apparatus.

As shown in FIG. 4, a bracket 31 is fixed at a lower surface of the base table 30 of the case 20. To the bracket 31, a cylinder 32 is attached. A rod 33 of the cylinder 32 supports a support board 36 on the upper surface of which a motor 34 and a bearing 35 are arranged. The rotation driving force of the motor 34 is transmitted to the bearing 35 through a belt 37.

An upper portion of the shaft 38 of the bearing 35 loosely threads through the base table 30 and connected to a lower end portion of the support rod 39. An upper portion of the support rod 39 is fixed to a proximal end portion of the arm member 26. The shaft 38 and support rod 39 are covered with slide covers 40 and 41. The lower cover 41 is connected to the base table 30. The upper cover 40 is attached to the arm member 26. The upper cover 40 is larger in diameter than the lower cover 41. When the rod 33 is retracted into the cylinder 32, the upper cover 40 slidably moves to the lower cover 41, with the result that the support rod 39 moves up the scrub portion 24 together with the arm member 26.

As shown in FIGS. 4 and 5, the arm member 26 is constituted of a frame 26a and a cover 26b and thus the inner space thereof is hollow. To eliminate the particles generated in the hollow arm member 26, the inner space of the arm member 26 is locally evacuated through the exhaust tube 82. Furthermore, to eliminate the particles generated outside the arm member 26, the outer space of the arm member 26 is locally evacuated through an exhaust tube 81.

The support rod 39 mentioned above is connected to a lower surface of a proximal end side of the frame 26a. A scrub wash assembly 25 is attached to a distal end side of the frame 26a. An upper half portion of the scrub wash assembly 25 is covered with the cover 26b and the frame 26a and thus hidden within the arm member 26. On the other hand, a lower half of the scrub wash assembly 25 protrudes downwardly out of the arm member 26 through an opening 26c. The scrub portion 24 is attached to the lower half portion of the scrub wash assembly 25.

An air cylinder 50 is attached to the frame 26a. The air cylinder 50 has a output shafts 53 protruding upward and downward as the output shaft. An upper portion 53a of the rod can be engaged with a rotation drive shaft 56 of a motor 52 via engage members 60, 64. A lower portion 53b of the rod is connected to the scrub 24 via an opening 26c, a coupling 54 and a holder 55.

The scrub portion 24 is held by the holder 55. The holder 55 is detachably attached to the coupling 54. The coupling 54 is detachably connected to the lower portion 53b of the rod. The scrub portion 24 of this embodiment, whose weight is 170–220 g, has a scrub member 85 made of sponge. As the scrub member 85, various sponges different in hardness (soft sponge to hard sponge) may be used. A soft sponge may be combined with a hard sponge as the scrub member 85. Such a scrub member 85 is capable of washing the surface of the wafer softly and uniformly without scratching a pattern formation surface or a pattern formation planning surface of the wafer W. Note that the scrub member may be a hard brush such as a hard-bristle nylon brush and a soft brush such as a soft-bristle mohair brush in accordance with an object to be washed.

As shown in FIG. 5, a seal ring 80 is attached to the lower surface of the frame 26a so as to surround the lower portion (output rod) 53b of the rod. The seal ring 80 has a depressed portion 80a. An upper portion 53a of the coupling 54 is inserted to the depressed portion 80a to engage with each other, thereby forming a labyrinth seal. Note that an exhaust tube 81 communicating with an exhaust apparatus 69 is attached to the seal ring 80. The opening of the exhaust tube 81 is formed at the depressed portion 80a so as to exhaust the particles generated by rub movement between the cylinder 50 and the lower portion 53b, through the exhaust tube 81. Since such a local evacuation is made, the particles may not fall on the wafer W during the scrub washing.

The process liquid supply tube 86 communicating with the process liquid supply unit 88 passes through the hollow arm member 26 and opened near the scrub portion 24. The process liquid supply unit 88 houses a pure wafer supply source and a flow rate control valve. A power supply switch (not shown) of the flow rate control valve is connected to the controller 73. When the controller 73 sends an instruction signal to the process liquid supply unit 88, pure water is sent from the unit 88 to a supply pipe 86 and output from an output port of the supply pipe 86 toward the scrub member 24.

Figure 6:
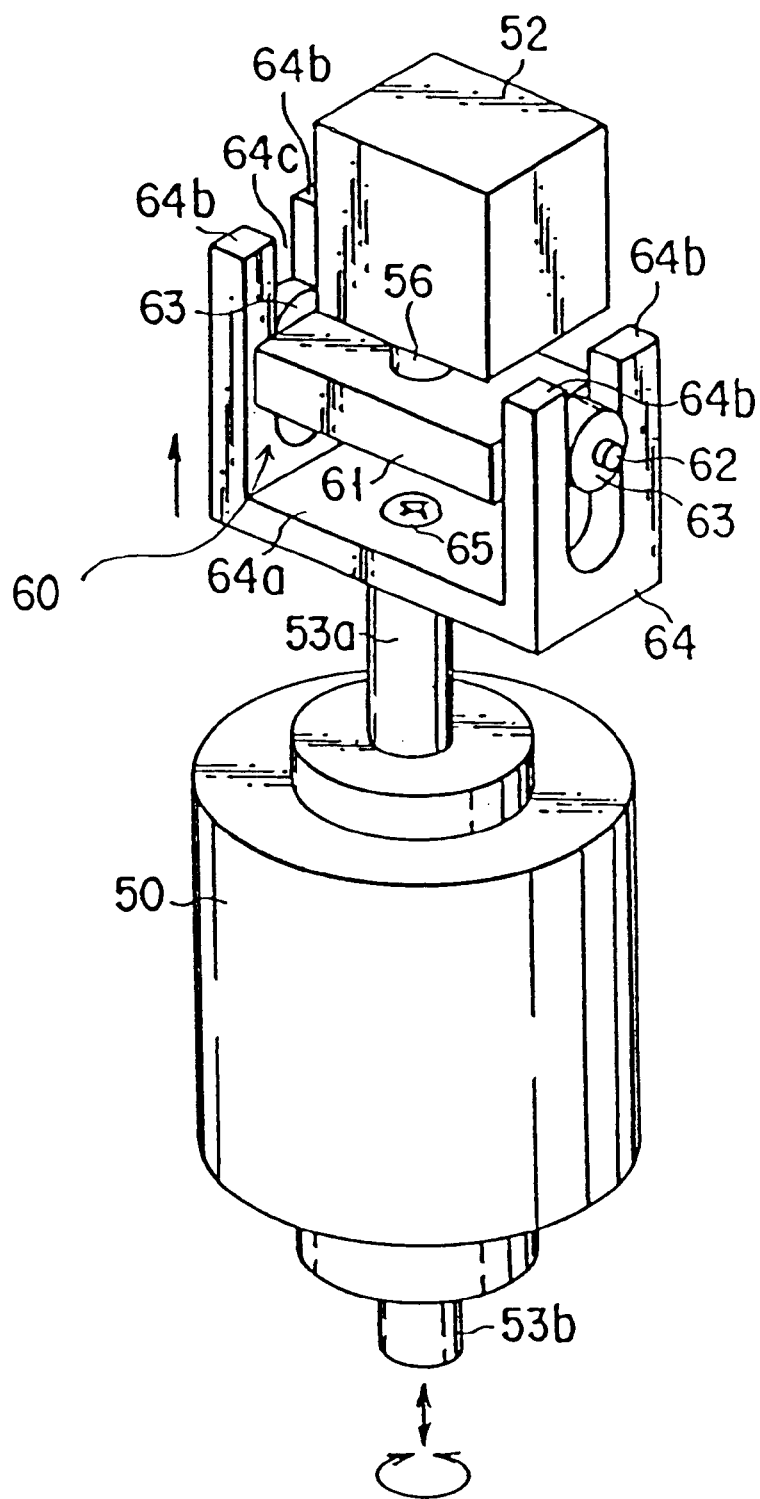
FIG. 6 is a perspective view showing that the drive engage section is engaged with the driven engage section according to the first embodiment.

Now, referring to FIG. 6, we will explain a rotation drive force transmitting mechanism for transmitting a rotation drive force of the motor 52 to output shafts 53.

The air cylinder 50, which is provided in the arm member 26, has an output shaft 53. The output shaft 53 has an upper portion 53a of the rod protruding upward of the cylinder 50 and the lower portion of the rod 53b protruding downward of the cylinder 50. As shown in FIG. 6, the driven engage member 64 is attached onto the upper portion 53a by means of a screw 65. The driven engage member 64 has a second rectangular board 64a and four vertical projections 64b. The vertical projections 64b stand on corners of the second rectangular board 64a, respectively. Depressed portions 64c are formed between two adjacent vertical projections 64a. To describe more specifically, the depressed portions 64c are formed between two pairs of vertical projections 64b standing side by side along a short side of the second rectangular board 64a.

On the other hand, as shown in FIG. 5, the stepping motor 52 is attached to an upper surface of the bracket 51 fixed on the air cylinder 50. More specifically, the air cylinder 50 and the motor 52 are individually fixed to a common bracket 51 in such a way that the motor 52 is located immediately above the air cylinder 50. The rotation drive shaft 56 of the motor 52 extends downward and arranged concentrically in line with the output shaft 53. To the rotation drive shaft 56, a drive engage member 60 is attached. The drive engage member 60 has a first rectangular board 61 connected to a rotation drive shaft 56, a horizontal support shaft 62 and a pair of rollers 63. Each of the roller 63 is rotatably supported by a side surface of the first rectangular board 61 with the aid of a horizontal support shaft 62. The pair of rollers 63 are arranged so as to correspond to a pair of depressed portions 64c, as shown in FIG. 6.

When the output shaft 53 is moved upward to lift up the driven engage member 64, the depressed portion 64c is guided a long the roller 63 to move up the driven engage member. Thereupon, the rotation drive force of the motor 52 is transmitted directly to the output shaft 53 through the engage members 60, 64. At the same time, pressing force of the cylinder 50 is directly transmitted to the output shaft 53.

As shown in FIG. 5, an exhaust tube 82 is attached to the bracket 51. The opening of the exhaust tube 82 is formed near the portion at which the drive engage member 60 is engaged with the driven engage member 64 to exhaust the particles generated at the engage portion. Note that the exhaust tube 82 is merged with a lower exhaust tube 81 at a merge portion 83 and communicates with a suction port of the vacuum exhaust apparatus 69. In this way, attachment of the particles to the wafer W can be efficiently prevented by the local evacuation.

Figure 7:
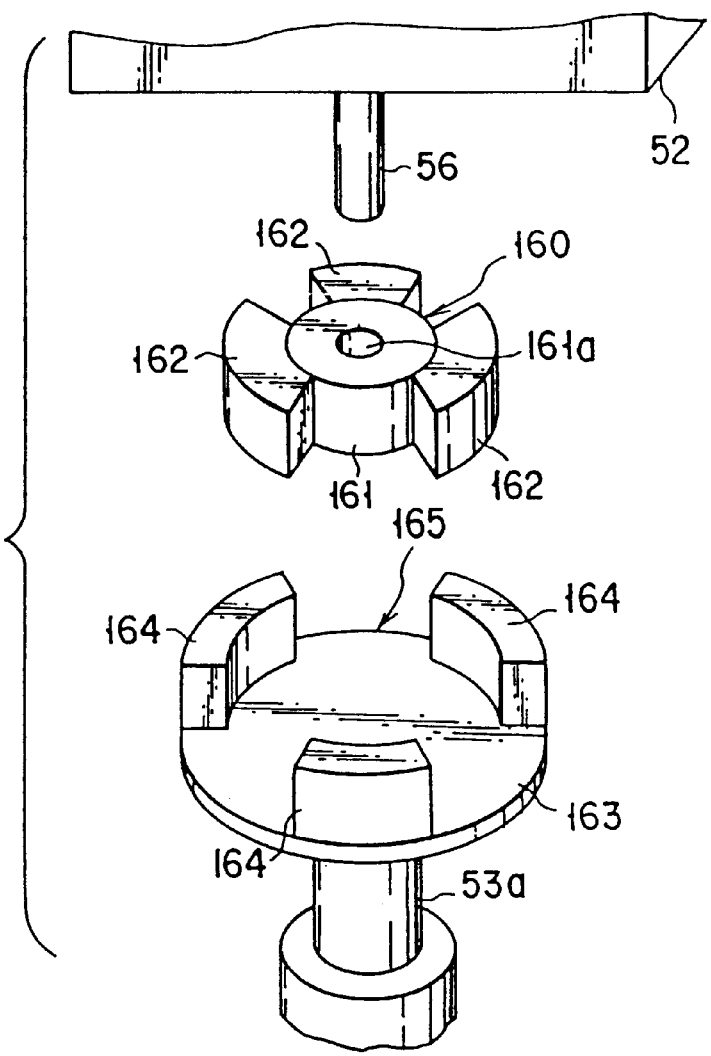
FIG. 7 is an exploded perspective view showing a drive engage section in engagement of a driven engage section according to a second embodiment.
Figure 8:
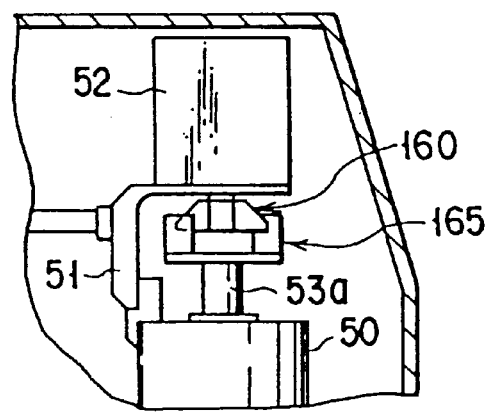
FIG. 8 is a perspective sectional view showing the state where a drive engage member is engaged with a driven engage member.

Now, referring to FIGS. 7 and 8, another rotation driving force transmitting mechanism will be explained.

The rotation driving force transmitting mechanism according to another embodiment has a drive engage member 160 and a driven engage member 165. The drive engage member 160 has a cylindrical portion 161 having a hole 161a and three first projections 162 attached in the outer periphery of the cylindrical portion 161. To the hole 161a of the cylindrical portion 161, a tip portion of the rotation drive shaft 56 is fitted into and combined therewith. The drive engage member 160 is rotated by the motor 52.

On the other hand, the driven engage member 165 has a disk portion 163 and three second projections 164 attached around an upper surface of the disk portion 163. To the lower surface of the disk portion 163, an output shaft 53a of the air cylinder 50 is connected. When the output shaft 53 is allowed to protrude upward from the cylinder 50, each of the second projections 164 is fitted between the adjacent first projections 162. Since the driven engage member 165 is engaged with the drive engage member 160, the rotation driving force of the motor 52 is ready to transmit directly to the output shaft 53. Note that the engage members 160, 165 are made of polyethylene terephthalate (PET) resin.

Figure 9:
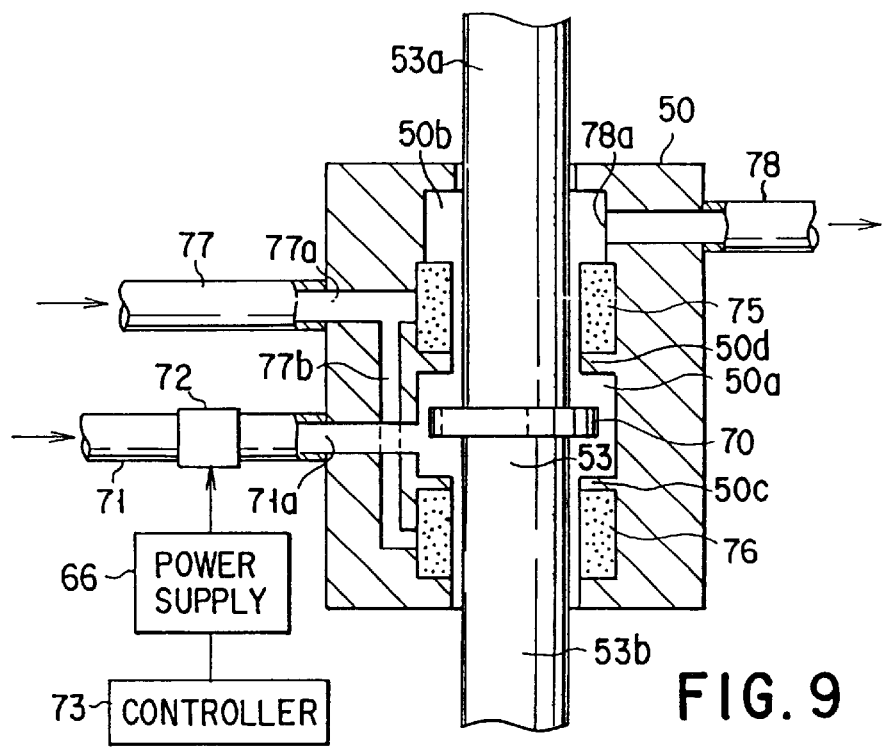
FIG. 9 is a cross sectional view showing an inner structure of an air cylinder accompanying a block diagram of the peripheral elements.

As shown in FIG. 9, an air supply chamber 50a and exhaust-air supply chamber 50b are formed inside the air cylinder 50. Two air supply pipes 71, 77 are individually communicated with the air supply chamber 50a. A air supply pipe and an air exhaust pipe 78 are individually communicated with the exhaust-air supply chamber 50b. The exhaust-air supply chamber 50b is located above the air supply chamber 50a and both chambers are communicated with each other.

Figure 10:
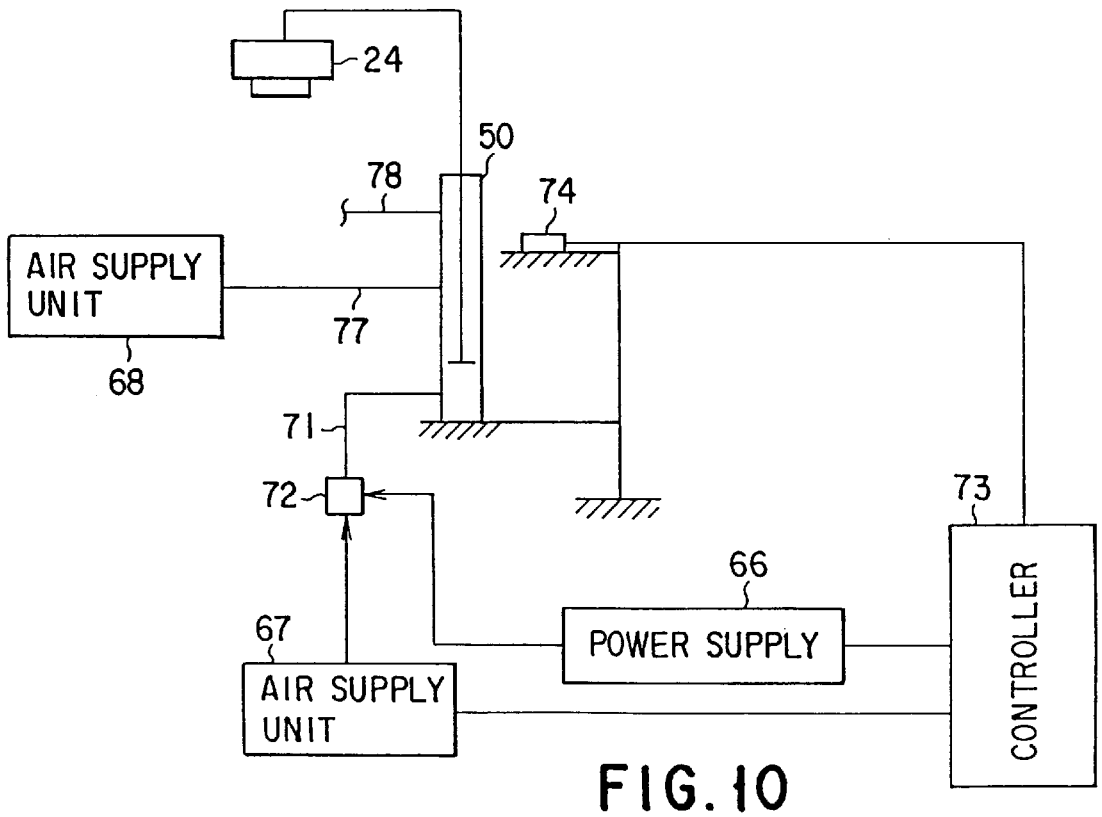
FIG. 10 is a block diagram showing a circuit of the air cylinder equipped with an electrical air supply regulator.

As shown in FIG. 10, the exhaust pipe 78 communicates with the exhaust air supply chamber 50b. The air supply pipe 77 communicates with an air supply apparatus 68, whereas the air supply pipe 71 communicates with an air supply apparatus 67 by way of the electrical air supply regulator 72. The controller 73 is connected to the power supply 66 of the electrical air supply regulator 72 to control the air supply to the air supply chamber 50a by the controller 73.

Note that the exhaust pipe 78 is an open passage for releasing an inner pressure of the cylinder 50 outside.

The air supply apparatuses 67, 68 are discretely provided in this embodiment. However, air may be supplied from a common air supply apparatus to each of the two air supply pipes 71, 77. Note that air is always supplied to the air supply chamber 50a and the exhaust air supply chamber 50b from the air supply pipe 77. In contrast, air is supplied from the air supply pipe 71 only when the scrub member 85 presses to the wafer W.

The air supply pipe 77 is branched into two flow passages 77a, 77b within the air cylinder 50. An opening of the branched passage 77a is formed within the exhaust-air supply chamber 50b. An opening of the branched passage 77b is formed within the air supply chamber 50a. Air bearings 75, 76 are formed in the passages 77a, 77b, respectively. An air cushion is formed in a slit between the rod 53 and the bearings 75 and 76 by supplying air. Since rub resistance between the rod 53 and the cylinder 50 is reduced by the bearings 75, 76, the scrub washing apparatus is excellent in abrasion resistance and produces few amount of particles. Note that the air bearings 75, 76 are made of porous ceramic in the form of a ring.

As shown in FIG. 9, a ring-form stopper 70 is attached to a piston rod 53 serving as an output shaft inside the air cylinder 50. The stopper 70 is provided in the air chamber 50a of the air cylinder 50, thereby preventing the output shaft 53 from coming out of the cylinder 50. Note that the stopper 70 may be formed within the exhaust air supply chamber 50b.

During the scrub washing process, the stopper 70 can be kept in contact with neither upper sheet 50c nor lower sheet 50d within the air supply chamber 50a as shown in FIG. 9. As described, it is possible to control the scrub contact pressure at 20 gf or less by applying thrust upwardly to the output shaft 53. The scrub contact pressure can be changed to, for example, 10 gf, 20 gf, 30 gf, 40 gf, or 50 gf by controlling the power supply source of the electrical air supply regulator 72 of the controller 73.

Now, we will explain the case where the wafer W is scrub-washed by using the scrub washing apparatus mentioned above.

First, a shutter is opened, and then, the wafer W is loaded into the unit 7 through the loading/unloading port 7a and mounted on the spin chuck 22. The wafer W is held by the spin chuck 22 and rotated at a predetermined speed. Then, the arm member 26 is rotated and the scrub portion 24 is located above a rotation center of the wafer W. The output shaft 53 is moved up to engage the driven engage member 64 (165) with the drive engage member 60 (160). Subsequently, a rotation driving force of the motor 52 is transmitted from the rotation drive shaft 56 to the output shaft 53 to rotate the scrub portion 24. Since the rotation driving force is transmitted directly to the output shaft 53, it becomes easy to control the rotation speed of the scrub portion 24.

While the scrub 24 is placed in a home position (stand-by position), the pressing force to be applied to the output shaft 53 is previously set at a value equal to the predetermined scrub pressure.

The arm member 26 is moved down by the cylinder 32 to bring the rotating sponge 85 into contact with the upper surface of the wafer W. Note that the weight of the scrub portion 24 is set at, for example, 200 gf. Furthermore, the scrub contact pressure is adjusted at 20 gf or less by controlling air supply to the air supply chamber 50a of the air cylinder. In this case, thrust of the output shaft 53 working upwardly is controlled by air supply pressure, so that the scrub contact pressure of the scrub portion 24 can be smoothly controlled. The thrust of the output shaft 53 is not adversely affected while the thrust and rotation of the output shaft 53 are controlled, it becomes easy to control the rotation of the scrub portion 24.

Furthermore, complicated transmission parts such as a belt or a pulley are not required, so that rotation driving force of the motor 52 can be transmitted to the rod 53 by use of a simple mechanism. As a result, the structure of the arm member 26 is simplified. In addition, no particles are generated due to rubbing between the belt and the pulley, unlike the conventional case.

On the other hand, as shown in FIG. 9, since the movement of the rod 53 is supported by the air bearings 75, 76 in the air cylinder 50, the rod is not rubbed with the bearing, unlike the conventional case. Furthermore, as shown in FIG. 5, when an exhaust apparatus 69 is driven, evacuation of air is initiated through the exhaust tubes 81, 82. If particles are produced at the lower outer peripheral portion of the rod 53, the drive engage member 60 and the driven engage member 65, they are exhausted by the exhaust tubes 81, 82. In this way, the particles can be prevented from being scattering beforehand.

If necessary, while pure wafer is output from a pure wafer supply passage 86, the arm member 26 is rotationally moved at least from the center to the peripheral portion by operating the motor 34 to thereby wash the surface of the wafer W uniformly. Thereafter, both the nozzle 87 and the wafer W are moved upward. While pure water is supplied onto the upper surface of the wafer W from the nozzle 87, the wafer surface is washed. After completion of the wash, attached solution is removed from the wafer W by rotating the spin chuck 22 at a high speed. In this way, the surface of the wafer is dried. The wafer W is then unloaded from the unit 6.

According to the apparatus of the aforementioned embodiment, since the rotation driving force is directly transmitted from the motor 52 to the rod 53, the rod 53 is not affected by various external disturbances. Therefore, it becomes easy to control the pressing force and the rotation of the scrub portion 24. As a result, a predetermined scrub contact pressure can be stably obtained during the washing process, improving the reliability of the washing process.

Furthermore, since complicated parts such as a belt and a pulley are not required, the structure of the arm member 26 can be simplified and the production of particles within the arm member 26 can be prevented. Accordingly, it is possible to reduce the number of parts used in a surface processing apparatus 7 and mitigate load for assembly of the apparatus. Consequently, reduction in yield due to the particle attachment can be prevented.

In the foregoing, exemplary embodiments of the present invention will be explained. However, the present invention is not limited to them and may be modified in various ways. For example, the substrate is not limited to a semiconductor wafer W as described in the embodiments. An LCD substrate, glass substrate, CD substrate, photomask, print substrate, ceramic substrate, and the like may be used.

According to the present invention, since the rotation driving force is directly transmitted to the output shaft, the output axis is not affected by external disturbances (tension of the belt etc.). It follows that the scrub contact pressure and rotation drive can be readily controlled. As a result, it is possible to obtain the scrub contact pressure stably during the processing and thus the reliability of the processing can be improved. Furthermore, since complicated transmitting parts such as a belt and a pulley, are not required, it is possible to construct the arm member simply and thus particles are prevented from being produced in the arm member. Therefore, it is possible to reduce that parts used in the processing apparatus and mitigate the load required for assembly of the apparatus. As a result, it is possible to prevent a reduction in yield due to the particle attachment.

If the thrust of the output shaft working in a vertical direction is controlled by air supply pressure, the scrub contact pressure can be smoothly controlled. Furthermore, the up-and-down moving operation and the rotational operation of the output shaft are supported by using air pressure, the bearing of the output shaft exhibits excellent rub resistance and abrasion resistance. Even if particles are produced, the scattering of particles can be prevented beforehand.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A scrub washing method of scrubbing a substrate with a scrub member while a washing liquid is supplied to the substrate by transmitting a pressing force and a rotation driving force to the scrub member by means of an output shaft and a rotation drive shaft, the output shaft being engaged with the rotation drive shaft and arranged on an extension line of the rotation drive shaft, and having a portion that is located in an air cylinder, said portion being equipped with a stopper, said washing method comprising the steps of:

(a) measuring a scrub contact pressure applied to a sensor from the scrub member by bringing the scrub member into contact with the sensor at a home position, obtaining data of electrical signal when the scrub contact pressure becomes equal to a desired pressure on the basis of the measuring results, and storing said data in a memory;

(b) mounting the substrate on a mounting table;

(c) moving the scrub member above the substrate mounted on the mounting table;

(d) moving down the scrub member together with the output shaft by supplying air around the output shaft in the air cylinder;

(e) transmitting a rotation drive force to the output shaft from the rotation drive shaft to rotate the scrub member; and (f) retrieving said data from the memory and adjusting the pressing force of the scrub member to the substrate such that the scrub member applies the desired pressure to the substrate based on the retrieved data by supplying air towards the stopper in the air cylinder and applying thrust upwardly to the output shaft.

2. The method according to claim 1, wherein the steps (e) and (f) are initiated after the step (a).

3. The method according to claim 1, wherein the step (f) is initiated before the step (b).

4. The method according to claim 1, wherein, in the step (f), the pressing force of the scrub member is controlled by applying thrust upwardly to the output shaft.

5. The method according to claim 1, wherein the substrate is rotated while the scrub member is in contact with the substrate.

* * * * *